US008715833B2

(12) United States Patent
Yamada et al.

(10) Patent No.: US 8,715,833 B2
(45) Date of Patent: May 6, 2014

(54) ANISOTROPIC CONDUCTIVE FILM

(75) Inventors: Yasunobu Yamada, Tochigi (JP);
Yasushi Akutsu, Tochigi (JP); Kouichi Miyauchi, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 533 days.

(21) Appl. No.: 13/002,543

(22) PCT Filed: Apr. 9, 2009

(86) PCT No.: PCT/JP2009/057256
§ 371 (c)(1),
(2), (4) Date: Jan. 4, 2011

(87) PCT Pub. No.: WO2010/004793
PCT Pub. Date: Jan. 14, 2010

(65) Prior Publication Data
US 2011/0110066 A1 May 12, 2011

(30) Foreign Application Priority Data

Jul. 11, 2008 (JP) ................................. 2008-181294

(51) Int. Cl.
B32B 7/02 (2006.01)
B32B 27/20 (2006.01)
B32B 27/26 (2006.01)
B32B 27/30 (2006.01)
B32B 37/06 (2006.01)
B32B 37/16 (2006.01)
C09J 133/00 (2006.01)

(52) U.S. Cl.
USPC ........... 428/515; 156/330; 156/332; 428/356; 428/355 EP; 428/355 AC; 428/413

(58) Field of Classification Search
USPC .............. 156/327, 330, 332; 428/343, 355 R, 428/356, 355 EP, 355 EN, 355 AC, 413, 500, 428/515
See application file for complete search history.

(56) References Cited

U.S. PATENT DOCUMENTS

| 8,067,514 | B2* | 11/2011 | Miyauchi et al. ............. 526/228 |
| 8,247,701 | B2* | 8/2012 | Usui et al. ..................... 174/260 |
| 2006/0116434 | A1* | 6/2006 | Sasaki et al. .................. 521/142 |
| 2012/0292082 | A1* | 11/2012 | Miyauchi et al. ............. 174/250 |

FOREIGN PATENT DOCUMENTS

| CN | 1696234 A | 11/2005 | |
| JP | A-2004-67908 | 3/2004 | |
| JP | A-2005-197032 | 7/2005 | |
| JP | 2005320455 A | * 11/2005 | ................ C09J 4/00 |
| JP | A-2006-199825 | 8/2006 | |
| JP | A-2007-150324 | 6/2007 | |
| JP | A-2008-34232 | 2/2008 | |
| JP | A-2008-71748 | 3/2008 | |
| TW | I230191 B | 4/2005 | |
| TW | 200728422 A | 8/2007 | |
| TW | 200815560 A | 4/2008 | |
| TW | 200837858 A | 9/2008 | |
| WO | WO 2006/093315 A1 | 9/2006 | |
| WO | WO 2007125993 A1 | * 11/2007 | ............. H01R 11/01 |

OTHER PUBLICATIONS

Machine translation of JP 2005320455 A, provided by the JPO website (no date).*
Partial translation of JP 2004-067908 A, provided by the USPTO translations branch (no date).*
Machine translation of JP 2007-150324, provided by the JPO website.*
Chinese Office Action issued in Application No. 200980127028.9; Dated Nov. 13, 2012 (With Translation).
International Preliminary Report on Patentability dated Mar. 24, 2011 in corresponding International Application No. PCT/JP2009/057256.
Korean Office Action issued in Application No. 10-2011-7000554; Dated May 28, 2013 (With Translation).
Jul. 10, 2012 Office Action issued in Taiwanese Patent Application No. 098112733 (with translation).
Oct. 19, 2012 Office Action issued in Korean Patent Application No. 10-2011-7000554 (with Translation).
International Search Report dated Jul. 14, 2009 in corresponding International Application No. PCT/JP2009/057256 (with translation).
Taiwanese Office Action issued in Application No. 098112733; Dated Dec. 5, 2012 (With Translation).
Chinese Office Action issued in Application No. 200980127028.9; Dated May 20, 2013 (With Translation).
Taiwanese Office Action issued in Application No. 098112733; Dated Jun. 17, 2013 (With Translation).
Nov. 19, 2013 Office Action issued in Japanese Application No. 2009-094618 (w/ English Translation).
Nov. 22, 2013 Office Action issued in Chinese Application No. 200980127028.9 (w/ English Translation).

* cited by examiner

Primary Examiner — Michael J Feely
(74) Attorney, Agent, or Firm — Oliff PLC

(57) ABSTRACT

A high adhesive strength and good conduction reliability can be realized when anisotropic connection is performed under compression conditions of a compression temperature of 130° C. and a compression time of 3 seconds using an anisotropic conductive film which uses a polymerizable acrylic compound capable of being cured at a comparatively lower temperature and in a comparatively shorter time than a thermosetting epoxy resin along with a film-forming resin. Consequently, an anisotropic conductive film has a structure in which an insulating adhesive layer and an anisotropic conductive adhesive layer are laminated. The insulating adhesive layer and the anisotropic conductive adhesive layer each contain a polymerizable acrylic compound, a film-forming resin, and a polymerization initiator. The polymerization initiator contains two kinds of organic peroxide having different one minute half-life temperatures. Of the two kinds of organic peroxide, the organic peroxide having the higher one minute half-life temperature produces benzoic acid or a derivative thereof by decomposition.

11 Claims, 2 Drawing Sheets

ANISOTROPIC CONDUCTIVE FILM

TECHNICAL FIELD

The present invention relates to an anisotropic conductive film, a connection structure using the same, and a production method thereof.

BACKGROUND ART

Generally, when connecting a liquid crystal panel with a tape carrier package (TCP) substrate or a chip-on-film (COF) substrate, or when connecting a TCP or a COF substrate with a printed wiring board (PWB), an anisotropic conductive film (ACF) formed by molding a thermosetting resin composition including a thermosetting epoxy resin, a polymerization initiator, and conductive particles in a film form is widely used. In this case, usually, the compression temperature is about 180 to 250° C. and the compression time is about 5 to 10 seconds.

However, recently, to reduce thermal stress on a PWB electrode member or the ITO electrode of a liquid crystal panel, there is a need to reduce the compression temperature during thermocompression using an anisotropic conductive film. Further, not only to reduce thermal stress, but also to improve the production efficiency, there is a need to shorten the compression time. Consequently, instead of the thermosetting epoxy resin constituting the anisotropic conductive film, attempts have been made to use a polymerizable acrylic compound capable of being cured at a lower temperature and in a shorter time along with a film-forming resin. In this case, as the polymerization initiator, it has been proposed to use an organic peroxide (for example, dibenzoyl peroxide (one minute half-life temperature 130° C.), dilauroyl peroxide (one minute half-life temperature 116.4° C.), di(3,5,5-trimethylhexanoyl)peroxide (one minute half-life temperature 112.6° C.) and the like) which does not produce gases due to self-decomposition and which has a comparatively low one minute half-life temperature of 100° C. to 130° C. (Patent Document 1).

PRIOR ART DOCUMENTS

Patent Documents

[Patent Document 1] Japanese Patent Application Laid-Open No. 2006-199825

SUMMARY OF THE INVENTION

Problems to be Solved by the Invention

However, when performing anisotropic conductive connection with an anisotropic conductive film containing a polymerizable acrylic compound and an organic peroxide such as described above, to reduce the compression temperature and compression time, if compression is carried out under conditions of a compression temperature of 130° C. or less and a compression time of 3 seconds, the adhesive strength of the anisotropic conductive film to an electronic part or a flexible substrate has been insufficient. Consequently, there is the problem that connection reliability has not been sufficient. As a result, despite using a polymerizable acrylic compound capable of reducing the curing temperature and shortening the curing time more than an epoxy resin, the compression temperature has had to be 150° C. or more and the compression time 5 seconds or more.

Furthermore, TCP substrates have both a lower mounting density and procurement cost than COF substrates, and yet exhibit the differences illustrated in Table 1. Especially, a COF substrate is not produced by laminating Cu on a polyimide base via an adhesive. Therefore, when joining with a PWB by an anisotropic conductive film, a COF substrate greatly differs from a TCP substrate, which is produced by laminating Cu on a polyimide base via an adhesive, in that the anisotropic conductive film and the polyimide base of the COF substrate are in direct contact. Due to this difference, there is the problem that the adhesive strength (peel strength) between the COF substrate and the anisotropic conductive film is smaller than the adhesive strength (peel strength) between a TCP substrate and the anisotropic conductive film. Therefore, during actual mounting, currently anisotropic conductive films for TCP substrates and anisotropic conductive films for COF substrates are used separately. Thus, there is a need for an ACF which can be used for both a TCP substrate and a COF substrate to facilitate mounting processes using an anisotropic conductive film (prevent application of the wrong anisotropic conductive film) and to simplify anisotropic conductive film inventory management.

TABLE 1

| | Constituent Element | | | Characteristic | | |
|---|---|---|---|---|---|---|
| | Polyimide | Adhesive | | | | |
| Substrate | Base Thickness | Layer Thickness | Cu Thickness | Hardness | Adhesion Face | Wiring Height |
| TCP | 75 μm | 12 μm | 18 μm | Hard | Adhesive layer | High |
| COF | 38 μm | None | 8 μm | Soft | Polyimide | Low |

The present invention resolves the above-described problems in the conventional art. It is an object of the present invention to enable a high adhesive strength and good conduction reliability to be realized when, for example, a TCP substrate or a COF substrate and a PWB are anisotropically connected under conditions of a compression temperature of 130° C. and a compression time of 3 seconds using an anisotropic conductive film which uses a polymerizable acrylic compound capable of being cured at a comparatively lower temperature and in a comparatively shorter time than a thermosetting epoxy resin along with a film-forming resin.

Means for Solving the Problems

The present inventors discovered that the above-described object can be achieved by using an anisotropic conductive film that is formed from an insulating adhesive layer and an anisotropic conductive adhesive layer, which each contain a polymerizable acrylic compound, a film-forming resin, and a polymerization initiator, and by further using, as an organic peroxide, two kinds of organic peroxide having different one minute half-life temperatures, wherein of the two kinds of organic peroxide, the organic peroxide having the higher one minute half-life temperature produces benzoic acid by decomposition, thereby completing the present invention.

Specifically, the present invention provides an anisotropic conductive film comprising an insulating adhesive layer and an anisotropic conductive adhesive layer laminated thereon, wherein the insulating adhesive layer and the anisotropic conductive adhesive layer each contain a polymerizable acrylic compound, a film-forming resin, and a polymerization initiator, wherein the anisotropic conductive adhesive layer further contains conductive particles, and the polymerization initiator contains two kinds of organic peroxide having different one minute half-life temperatures, wherein of the two kinds of organic peroxide, the organic peroxide having the higher one minute half-life temperature produces benzoic acid or a derivative thereof by decomposition.

Furthermore, the present invention provides a connection structure in which a connection portion of a first wiring substrate and a connection portion of a second wiring substrate are anisotropically connected by the above anisotropic conductive film.

Furthermore, the present invention provides a method for producing a connection structure, comprising:

sandwiching the above anisotropic conductive film between a connection portion of a first wiring substrate and a connection portion of a second wiring substrate;

temporarily bonding the anisotropic conductive film with the first and second wiring substrates at a first temperature at which an organic peroxide having a lower one minute half-life temperature does not decompose; and then thermo-compressing the anisotropic conductive film with the first and second wiring substrates at a second temperature at which an organic peroxide having a higher one minute half-life temperature does decompose.

Advantages of the Invention

The anisotropic conductive film according to the present invention has a laminated structure of an anisotropic conductive adhesive layer and an insulating adhesive layer, which each contain a polymerizable acrylic compound, a film-forming resin, and a polymerization initiator. Further, the anisotropic conductive film uses two kinds of organic peroxide having different one minute half-life temperatures as the polymerization initiator of the polymerizable acrylic compound in each layer. Of these two kinds of organic peroxide, the organic peroxide having the higher one minute half-life temperature produces benzoic acid or a derivative thereof by decomposition. Consequently, due to the presence of an organic peroxide having a relatively lower one minute half-life temperature, during rapid thermocompression at a relatively high temperature to promote the decomposition of the high-temperature decomposable organic peroxide, with an increase in the heating temperature, the low-temperature decomposable organic peroxide is made to decompose from a relatively low temperature for which it is not necessary to worry about thermal stress, thereby enabling the polymerizable acrylic compound to be sufficiently cured. Furthermore, the high-temperature decomposable organic peroxide is ultimately made to decompose, the curing of the polymerizable acrylic compound is completed, and benzoic acid is thereby produced. A part of the produced benzoic acid is present at the interface, and vicinity thereof, of the cured anisotropic conductive film and a connection target. Therefore, adhesive strength can be improved.

Furthermore, since the anisotropic conductive film has a laminated structure of the above-described insulating adhesive layer and anisotropic conductive adhesive layer, it can be used for both a TCP substrate and a COF substrate. Although uncertain, the reason for this is thought to be as follows.

Specifically, the insulating adhesive layer generally exhibits a lower glass transition temperature than the anisotropic conductive adhesive layer. Therefore, the insulating adhesive layer can be easily removed when a COF substrate or a TCP substrate is pressed on the anisotropic conductive film. Further, during joining the insulating adhesive layer tends to be widespread between electrodes adjacent in the planar direction. This insulating adhesive layer undergoes radical curing at a low temperature during joining, and at higher temperatures produces benzoic acid in addition to undergoing radical curing. Therefore, due to the produced benzoic acid, the insulating adhesive layer cures and strongly bonds to a contact face (metal electrode surface, polyimide surface, adhesive layer surface) with a COF substrate or TCP substrate. Since the anisotropic conductive layer has a higher glass transition temperature than the insulating adhesive layer, it is easier for conductive particles to be present between the electrodes mutually opposing each other when a COF substrate or a TCP substrate is pressed on the anisotropic conductive film. However, similar to the insulating adhesive layer, the anisotropic conductive layer undergoes radical curing at a low temperature, and at higher temperatures produces benzoic acid in addition to undergoing radical curing. Therefore, the anisotropic conductive adhesive layer cures and strongly bonds to the PWB and with the contact face with a COF substrate or TCP substrate. Thus, the insulating adhesive layer expresses stress alleviation and strong adhesion with a COF substrate or a TCP substrate, and the anisotropic conductive adhesive layer expresses good connection reliability between the COF substrate or TCP substrate and the PWB due to its strong cohesive force.

BEST MODE FOR CARRYING OUT THE INVENTION

Figure 1:
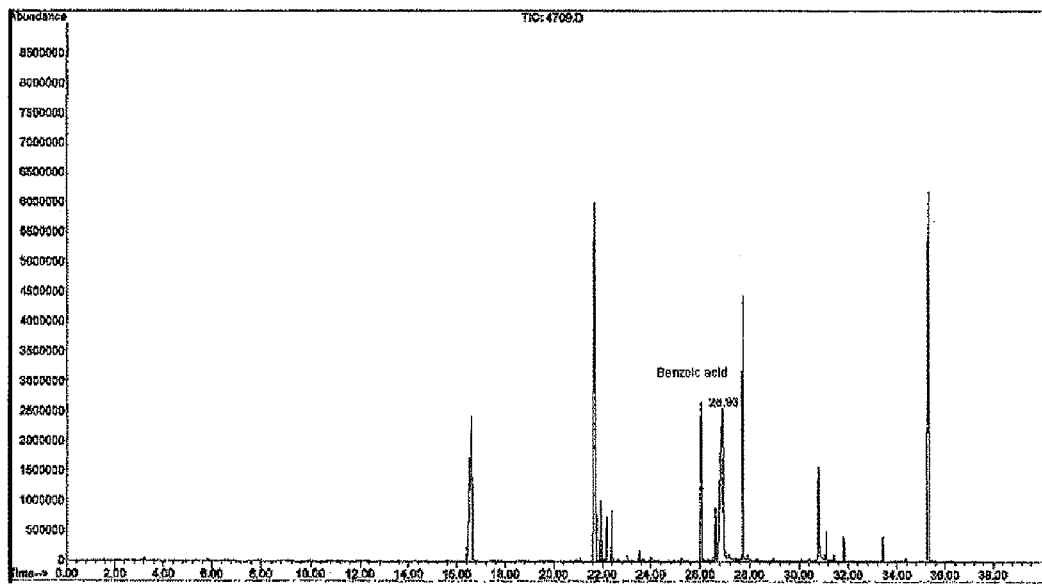
FIG. 1 is a GC-MS chart of the composition of Reference Example A2.

The anisotropic conductive film according to the present invention has a bilayer structure in which an insulating adhesive layer and an anisotropic conductive adhesive layer are laminated. The insulating adhesive layer and the anisotropic conductive adhesive layer each contain a polymerizable acrylic compound, a film-forming resin, and a polymerization initiator. The anisotropic conductive adhesive layer further contains conductive particles. Here, the polymerization initiator contains two kinds of organic peroxide having different decomposition temperatures. Of the two kinds of organic peroxide, the organic peroxide having the higher one minute half-life temperature produces benzoic acid or a derivative thereof by decomposition. Examples of benzoic acid derivatives here include methyl benzoate, ethyl benzoate, and t-butyl benzoate. The two kinds of organic peroxide may be exactly the same combination in the insulating adhesive layer and the anisotropic conductive adhesive layer, or may be a different combination.

If the one minute half-life temperature of the organic peroxide having the lower one minute half-life temperature (hereinafter, sometimes referred to as "low-temperature decomposable peroxide") of the two kinds of organic peroxide used as a polymerization initiator by the insulating adhesive layer and the anisotropic conductive adhesive layer of the anisotropic conductive film according to the present invention is too low, pre-curing storage stability is shortened. However, if this one minute half-life temperature is too high, the curing of the anisotropic conductive film tends to be insufficient. Therefore, this one minute half-life temperature is preferably 80° C. or more to less than 120° C. and more preferably 90° C. or more to less than 120° C. On the other hand, concerning the one minute half-life temperature of the organic peroxide having the higher one minute half-life temperature (hereinafter, sometimes referred to as "high-temperature decomposable peroxide"), organic peroxides having a low one minute half-life temperature are not commercially available. If this one minute half-life temperature is too high, there is a tendency for the benzoic acid or derivative thereof not to be produced at the envisaged thermocompression temperature. Therefore, this one minute half-life temperature is preferably 120° C. or more to 150° C. or less.

Furthermore, if the difference in one minute half-life temperatures between the low-temperature decomposable peroxide and the high-temperature decomposable peroxide is too small, the low-temperature decomposable peroxide and the high-temperature decomposable peroxide react with the polymerizable acrylic compound, resulting in the amount of benzoic acid contributing to the improvement in adhesive strength being reduced. If this difference is too large, the curing reactivity of the anisotropic conductive film at low temperatures tends to deteriorate. Therefore, this difference is preferably 10° C. or more to 30° C. or less.

If the mass ratio of the low-temperature decomposable peroxide with respect to the high-temperature decomposable peroxide is relatively too low, the curing reactivity of the anisotropic conductive film at low temperatures tends to deteriorate. Conversely, if this mass ratio is too high, adhesive strength tends to deteriorate. Therefore, this mass ratio is preferably 10:1 to 1:5.

Specific examples of the low-temperature decomposable peroxide that can be used in the present invention include diisobutyryl peroxide (one minute half-life temperature 85.1° C.), 1,1,3,3-tetramethylbutyl peroxy-2-ethylhexanoate (one minute half-life temperature 124.3° C.), dilauroyl peroxide (one minute half-life temperature 116.4° C.), di(3,5,5-trimethylhexanoyl) peroxide (one minute half-life temperature 112.6° C.), t-butyl peroxypivalate (one minute half-life temperature 110.3° C.), t-hexyl peroxypivalate (one minute half-life temperature 109.1° C.), t-butyl peroxyneoheptanoate (one minute half-life temperature 104.6° C.), t-butyl peroxyneodecanoate (one minute half-life temperature 103.5° C.), t-hexyl peroxyneodecanoate (one minute half-life temperature 100.9° C.), di(2-ethylhexyl)peroxydicarbonate (one minute half-life temperature 90.6° C.), di(4-t-butylcyclohexyl)peroxydicarbonate (one minute half-life temperature 92.1° C.), 1,1,3,3-tetramethylbutyl peroxyneodecanoate (one minute half-life temperature 92.1° C.), di-sec-butyl peroxydicarbonate (one minute half-life temperature 85.1° C.), di-n-propyl peroxydicarbonate (one minute half-life temperature 85.1° C.), and cumyl peroxyneodecanoate (one minute half-life temperature 85.1° C.). Two or more of these may be used together.

Further, specific examples of the high-temperature decomposable peroxide include di(4-methylbenzoyl)peroxide (one minute half-life temperature 128.2° C.), di(3-methylbenzoyl) peroxide (one minute half-life temperature 131.1° C.), dibenzoyl peroxide (one minute half-life temperature 130.0° C.), t-hexyl peroxybenzoate (one minute half-life temperature 160.3° C.), and t-butyl peroxybenzoate (one minute half-life temperature 166.8° C.). Two or more of these may be used together. By using these high-temperature decomposable peroxides which have a phenyl ring, the cohesive force of the anisotropic conductive film can be improved, which allows adhesive strength to be improved even further.

From the perspectives of storage stability and adhesive strength, a preferred combination of the low-temperature decomposable peroxide and the high-temperature decomposable peroxide is a combination of dilauroyl peroxide as the low-temperature decomposable peroxide and dibenzoyl peroxide as the high-temperature decomposable peroxide.

If the used amounts of such a polymerization initiator formed from two kinds of peroxide in the insulating adhesive layer and the anisotropic conductive adhesive layer, respectively, is too small, reactivity tends to be lost, while if the used amount is too much, the cohesive force of the anisotropic conductive film tends to deteriorate. Therefore, based on 100 parts by mass of the polymerizable acrylic compound, this used amount is preferably 1 to 10 parts by mass, and more preferably 3 to 7 parts by mass.

The polymerizable acrylic compound used by both the insulating adhesive layer and the anisotropic conductive adhesive layer of the anisotropic conductive film according to the present invention is a compound having one, and preferably two, acryloyl groups or methacryloyl groups (hereinafter, collectively referred to as "(meth)acryloyl group"). Here, to improve conduction reliability, the number of (meth)acryloyl groups in one molecule of the polymerizable acrylic compound is two or more, and preferably is two. Further, the polymerizable acrylic compound may be exactly the same specific compound for the insulating adhesive layer and the anisotropic conductive adhesive layer, or may be different.

Specific examples of the polymerizable acrylic compound include polyethylene glycol diacrylate, phosphate acrylates, 2-hydroxyethyl acrylate, 2-hydroxypropyl acrylate, 4-hydroxybutyl acrylate, isobutyl acrylate, t-butyl acrylate, isooctyl acrylate, bisphenoxyethanolfluorene diacrylate, 2-acryloyloxy ethylsuccinic acid, lauryl acrylate, stearyl acrylate, isobornyl acrylate, tricyclodecane dimethanol dimethacrylate, cyclohexyl acrylate, tris(2-hydroxyethyl)isocyanurate triacrylate, tetrahydrofurfuryl acrylate, o-phthalic acid diglycidyl ether acrylate, ethoxylated bisphenol A dimethacrylate, bisphenol A type epoxy acrylate, urethane acrylate, epoxy acrylate, and (meth)acrylates corresponding thereto.

From the perspective of obtaining a high adhesive strength and high conduction reliability, it is preferred to combine the polymerizable acrylic compound with 5 to 40 parts by mass of a bifunctional acrylate, 10 to 40 parts by mass of urethane acrylate, and 0.5 to 5 parts by mass of a phosphate acrylate. Here, the bifunctional acrylate is added to improve the cohesive force of the cured product and to improve conduction reliability. The urethane acrylate is added to improve adhesion with the polyimide. The phosphate acrylate is added to improve adhesion with metals.

If the used amount of the polymerizable acrylic compound in either the insulating adhesive layer or the anisotropic conductive adhesive layer is too low, conduction reliability tends to decrease. If this used amount is too large, the adhesive strength tends to decrease. Therefore, the used amount is preferably 20 to 70 mass %, and more preferably 30 to 60 mass %, based on the resin solid content (total of the polymerizable acrylic compound and the film-forming resin).

Examples of the film-forming resin used in both the insulating adhesive layer and the anisotropic conductive adhesive layer of the anisotropic conductive film according to the present invention include thermosetting elastomers such as polyester resins, polyurethane resins, phenoxy resins, polyamides, and EVAS. Of these, from the perspective of heat resistance and adhesion properties, examples include a polyester resin, a polyurethane resin, and a phenoxy resin, and especially a phenoxy resin, such as bis-A epoxy resins, and a phenoxy resin having a fluorene skeleton. Phenoxy resins having a fluorene skeleton have a property of increasing the glass transition temperature of a cured product. Therefore, it is preferred not to add such resin to the insulating adhesive layer, just to the anisotropic conductive adhesive layer. In that case, the ratio of phenoxy resin having a fluorene skeleton in the film-forming resin is preferably 3 to 30 mass %, and more preferably 5 to 25 mass %.

If the used amount of the film-forming resin in either the insulating adhesive layer or the anisotropic conductive adhesive layer is too low, a film is not formed. However, if this used amount is too large, the removability of the resin, which is needs to achieve electric connection, tends to deteriorate. Therefore, the used amount is preferably 80 to 30 mass %, and more preferably 70 to 40 mass %, based on the resin solid content (total of the polymerizable acrylic compound and the film-forming resin).

Conductive particles used in conventional anisotropic conductive films can be used as the conductive particles used in the anisotropic conductive adhesive layer of the anisotropic conductive film according to the present invention. Examples of such conductive particles include: metal particles such as gold particles, silver particles, and nickel particles; and metal-coated resin particles formed by coating the surface of particles of resins such as benzoguanamine resin and styrene resin with a metal such as gold, nickel, and zinc. The average particle size of such conductive particles is normally 1 to 10 μm, and more preferably 2 to 6 μm.

If the used amount of the conductive particles in the anisotropic conductive adhesive layer of the anisotropic conductive film is too small, conduction failure occurs. If this used amount is too large, a short circuit occurs. Therefore, the used amount is preferably 0.1 to 20 parts by mass, and more preferably 0.2 to 10 parts by mass, based on 100 parts by mass of the resin solid content.

The insulating adhesive layer and the anisotropic conductive adhesive layer of the anisotropic conductive film according to the present invention may optionally contain a diluting monomer such as various acrylic monomers, a filler, a softening agent, a coloring agent, a flame retardant, a thixotropic agent, a coupling agent and the like.

If the thickness of the insulating adhesive layer of the anisotropic conductive film according to the present invention is too thin, adhesive strength deteriorates, while if the thickness is too thick, conduction reliability deteriorates. Therefore, this thickness is preferably 10 to 25 μm, and more preferably 16 to 21 μm. On the other hand, if the thickness of the anisotropic conductive adhesive layer is too thin, conduction reliability deteriorates, while if the thickness is too thick, adhesive strength deteriorates. Therefore, this thickness is preferably 10 to 25 μm, and more preferably 15 to 20 μm. Further, if the thickness of the anisotropic conductive film which combines the insulating adhesive layer and the anisotropic conductive adhesive layer is too thin, adhesive strength deteriorates due to insufficient filling, while if the thickness is too thick, conduction failure occurs due to insufficient pressing. Therefore, this thickness is preferably 25 to 50 μm, and more preferably 30 to 45 μm.

The glass transition temperature of the cured products of both the insulating adhesive layer and the anisotropic conductive adhesive layer of the anisotropic conductive film according to the present invention is an important factor in making the anisotropic conductive film function as an underfilling agent. From this perspective, the glass transition temperature of the cured product of the insulating adhesive layer is preferably 50 to 100° C., and more preferably 65 to 100° C. On the other hand, the glass transition temperature of the cured product of the anisotropic conductive adhesive layer is preferably 80 to 130° C., and more preferably 85 to 130° C. Here, it is preferred to set the glass transition temperature of the cured product of the anisotropic conductive adhesive layer higher than the glass transition temperature of the cured product of the insulating adhesive layer. This allows the insulating adhesive layer to be fluidized slightly earlier, and thus be removed from between the mutually-opposing electrodes during the connection operation. More specifically, the glass transition temperature of the cured product of the anisotropic conductive adhesive layer is preferably set to 0 to 25° C. higher, and more preferably 10 to 20° C. higher.

The anisotropic conductive film according to the present invention can be produced by the same method as that used for conventional anisotropic conductive films.

The anisotropic conductive film according to the present invention can be obtained by the following procedure. For example, first, the polymerizable acrylic compound, the film-forming resin, the polymerization initiator, and, optionally, other additives with a solvent such as methyl ethyl ketone are uniformly mixed. The resultant composition for an insulating adhesive layer is coated onto the surface of a release sheet which has been subjected to a release treatment, and dried to form the insulating adhesive layer. Onto this layer, a composition for an anisotropic conductive adhesive layer, obtained by uniformly mixing the polymerizable acrylic compound, the film-forming resin, the conductive particles, the polymerization initiator, and, optionally, other additives with a solvent such as methyl ethyl ketone, is coated. Then, the coated composition is dried to form the anisotropic conductive adhesive layer, thereby completing the anisotropic conductive film.

The anisotropic conductive film according to the present invention can be preferably used for a connection structure in which a connection portion of a first wiring substrate and a connection portion of a second wiring substrate are anisotropically connected. The first and second wiring substrates are not especially limited. Examples thereof may include a glass substrate of a liquid crystal panel and flexible wiring substrates. Moreover, the connection portions of the respective substrates are also not especially limited. Connection portions used for conventional anisotropic conductive films may be used.

Thus, although the anisotropic conductive film according to the present invention can be used in various ways, among these, the anisotropic conductive film can preferably be applied to the case where the first wiring substrate is a COF substrate or a TCP substrate, and that the second wiring substrate is a PWB. This means that the anisotropic conductive film according to the present invention can be used for either a TCP substrate or a COF substrate. In this case, it is preferred that the film-forming resin in the anisotropic conductive adhesive layer contains a phenoxy resin having a fluorene skeleton. By containing such a resin, the glass transition temperature of the cured product of the anisotropic conductive adhesive layer can be made higher than the glass transition temperature of the insulating adhesive layer, and the connection reliability of the anisotropic conductive film can be improved.

Furthermore, in the above-described connection structure, it is preferred to arrange the insulating adhesive layer of the anisotropic conductive film on the first wiring substrate side. Consequently, the adhesive strength with respect to the polyimide surface, on which an adhesive layer is not formed, can be improved.

Such a connection structure can be produced by sandwiching the anisotropic conductive film according to the present invention between the connection portions of the first and second wiring substrates so that usually the insulating adhesive layer is arranged on the first wiring substrate side, temporarily bonding them at a first temperature at which the organic peroxide having the lower one-minute half-life temperature does not decompose, and thermo-compressing them at a second temperature at which the organic peroxide having the higher one-minute half-life temperature decomposes. Here, the organic peroxide having the lower one-minute half-life temperature, the organic peroxide having the higher one-minute half-life temperature, the preferred one-minute half-life temperatures thereof, and the preferred temperature difference therebetween are as already described above. Furthermore, the first temperature is preferably 20° C. lower than the one-minute half-life temperature of the organic peroxide having the lower one-minute half-life temperature, or lower. In addition, the second temperature is preferably 20° C. lower than the one-minute half-life temperature of the organic peroxide having the higher one-minute half-life temperature, or higher.

EXAMPLES

The present invention will now be described in more detail using the following examples.

Reference Examples A1 to A4 and B1 to B3

Compositions (A1 to A4) for forming the anisotropic conductive adhesive layer and compositions (B1 to B3) for forming the insulating adhesive layer were prepared by uniformly mixing the components shown in Table 2 by a common method. These compositions were coated onto a polyester release film in a single layer, and dried by blowing hot air at 70° C. for 5 minutes to produce an adhesive film.

Reference Examples A1 to A3 are examples of a composition for forming the anisotropic conductive adhesive layer which combine as the polymerization initiator a low-temperature decomposable organic peroxide and a high-temperature decomposable organic peroxide which produces benzoic acid during decomposition. Reference Example A4 is an example of a composition for forming the anisotropic conductive adhesive layer which only uses a low-temperature decomposable organic peroxide as the polymerization initiator. Furthermore, Reference Examples A2 and A3 are also examples of a composition for forming the anisotropic conductive adhesive layer which use a phenoxy resin having a fluorene skeleton for the film-forming resin.

Reference Example B1 is an example of a composition for forming the insulating adhesive layer which combines as the polymerization initiator a low-temperature decomposable organic peroxide and a high-temperature decomposable organic peroxide which produces benzoic acid during decomposition. Reference Example B2 is an example of a composition for forming the insulating adhesive layer which only uses a high-temperature decomposable organic peroxide which produces benzoic acid during decomposition as the polymerization initiator. Reference Example B3 is an example of a composition for forming the insulating adhesive layer which only uses a low-temperature decomposable organic peroxide as the polymerization initiator.

The "presence of benzoic acid production", "presence of low-temperature curability", and "glass transition temperature of cured product" of the obtained adhesive films (uncured) were investigated as described below. The obtained results are shown in Table 2.

<Presence of Benzoic Acid Production>

Figure 2:
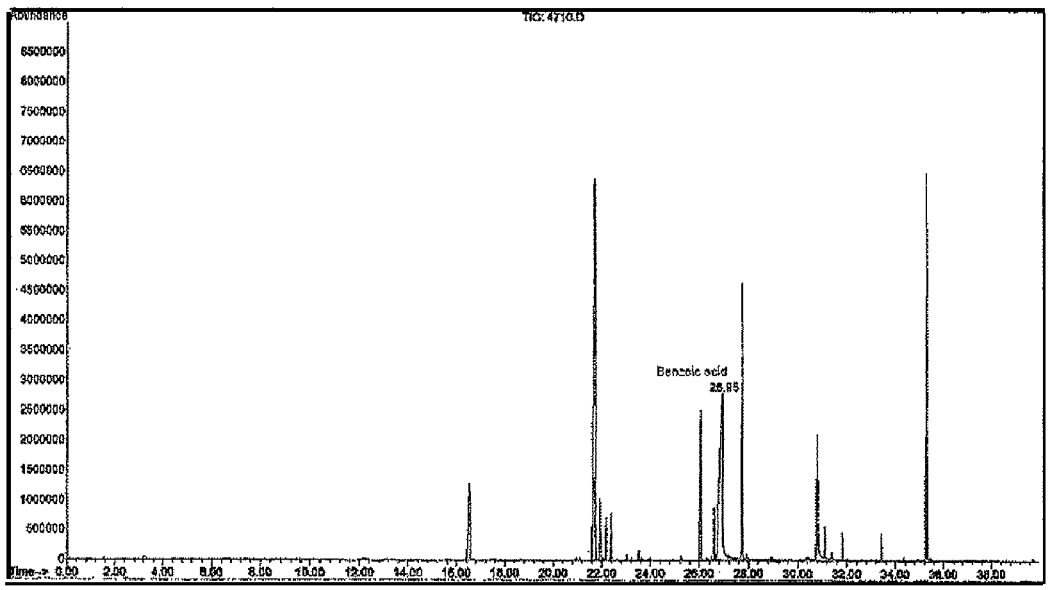
FIG. 2 is a GC-MS chart of the composition of Reference Example B1.

The adhesive films were placed in a sealed vessel, and heated for 15 minutes at 135° C. under a helium gas flow at 50 mL/min. The produced gases were collected (−20° C., Tenax 358), and subjected to GC-MS analysis under the following conditions to investigate whether benzoic acid was produced. The GC-MS charts of the compositions of Reference Examples A2 and B1 are shown in FIGS. 1 and 2, respectively.

Device: JHS 100 (manufactured by JAI), HP6890/5973 MS (manufactured by Agilent)
Injection Port: 280° C., Split 50:1
Column: DB1701 (30M)
Oven: 40° C. (15 minute retention)→240° C. (5 minute retention), increasing temperature 10° C./minute
IF, I/S temperature: 250° C., 230° C.
Scanning Region: 33 to 550° C.

<Presence of Low-temperature Curability and Glass Transition Temperature>

The low-temperature curability and glass transition temperature of the adhesive films were investigated using a dynamic viscoelasticity measurement apparatus (RHEOVIBRON DDV-01FP, Orientec Co., Ltd.).

TABLE 2

| Component (parts by mass) | Composition for Forming Anisotropic Conductive Adhesive Layer | | | | Composition for Forming Insulating Adhesive Layer | | |
| --- | --- | --- | --- | --- | --- | --- | --- |
| | A1 | A2 | A3 | A4 | B1 | B2 | B3 |
| Bis-A Epoxy Type Phenoxy Resin (YP-50, manufactured by NSCC Epoxy Manufacturing Co., Ltd.) | 40 | 30 | 40 | 40 | 40 | 40 | 40 |
| Phenoxy Resin Having Fluorene Skeleton (FX293, manufactured by NSCC Epoxy Manufacturing Co., Ltd.) | — | 10 | 10 | — | — | — | — |

TABLE 2-continued

| Component (parts by mass) | Composition for Forming Anisotropic Conductive Adhesive Layer | | | | Composition for Forming Insulating Adhesive Layer | | |
|---|---|---|---|---|---|---|---|
| | A1 | A2 | A3 | A4 | B1 | B2 | B3 |
| Bifunctional Acrylic Monomer (A-200, Shin-Nakamura Chemical Co., Ltd.) | 30 | 30 | 20 | 30 | 30 | 30 | 30 |
| Urethane Acrylate (U-2PPA, Shin-Nakamura Chemical Co., Ltd.) | 20 | 20 | 20 | 20 | 20 | 20 | 20 |
| Phosphate Acrylate (PM-2, Nippon Kayaku Co., Ltd.) | 5 | 5 | 5 | 5 | 5 | 5 | 5 |
| Ni Particles (particle size 3 μm) | 2 | 2 | 2 | 2 | — | — | — |
| Dilauroyl Peroxide (Low-Temperature Decomposition Peroxide) | 3 | 3 | 3 | — | 3 | — | 3 |
| Dibenzoyl Peroxide (High-Temperature Decomposition Peroxide) | 3 | 3 | 3 | 3 | 3 | 3 | — |
| Benzoic Acid Production | Yes | Yes | Yes | Yes | Yes | Yes | No |
| Low-temperature Curability | Yes | Yes | Yes | No | Yes | No | Yes |
| Glass Transition Temperature (° C.) | 72 | 91 | 92 | 74 | 72 | 74 | 68 |

Examples 1 to 3, Comparative Examples 1 to 7

The compositions of Reference Examples A1 to A4 and/or B1 to B3 were coated onto a polyethylene terephthalate (PET) release film so as to have the structure shown in Table 3, and then dried by blowing hot air at 70° C. for 5 minutes to produce an anisotropic conductive film. However, the anisotropic conductive films were formed so that the insulating adhesive layer was on the polyester release film side.

To determine the level of connection reliability, the conduction resistance of the obtained anisotropic conductive films was measured by a four-terminal method. More specifically, the anisotropic conductive films were thermo-compressed onto a printed wiring board (PWB) formed with wires at pitch of 200 μm on a 35 μm thick copper foil on a surface of a glass epoxy substrate, at 80° C. at 1 MPa for 2 seconds. The PET release film was peeled off, and the anisotropic conductive films were temporarily bonded to the PWB surface. A COF substrate (wiring substrate formed with 8 μm thick copper wires at a 200 μm pitch on a 38 μm thick polyimide film) or a TCP substrate (wiring substrate formed from a 12 μm thick epoxy adhesive layer on a 75 μm thick polyimide film, with 18 μm thick copper wires at a 200 μm pitch formed above the epoxy adhesive layer) was placed at its copper wire portion on these anisotropic conductive films. The resultant structures were compressed under conditions of 130° C., 3 MPa, and 3 seconds or 190° C., 3 MPa, and 5 seconds to obtain connection structures for evaluation.

Figure 3:
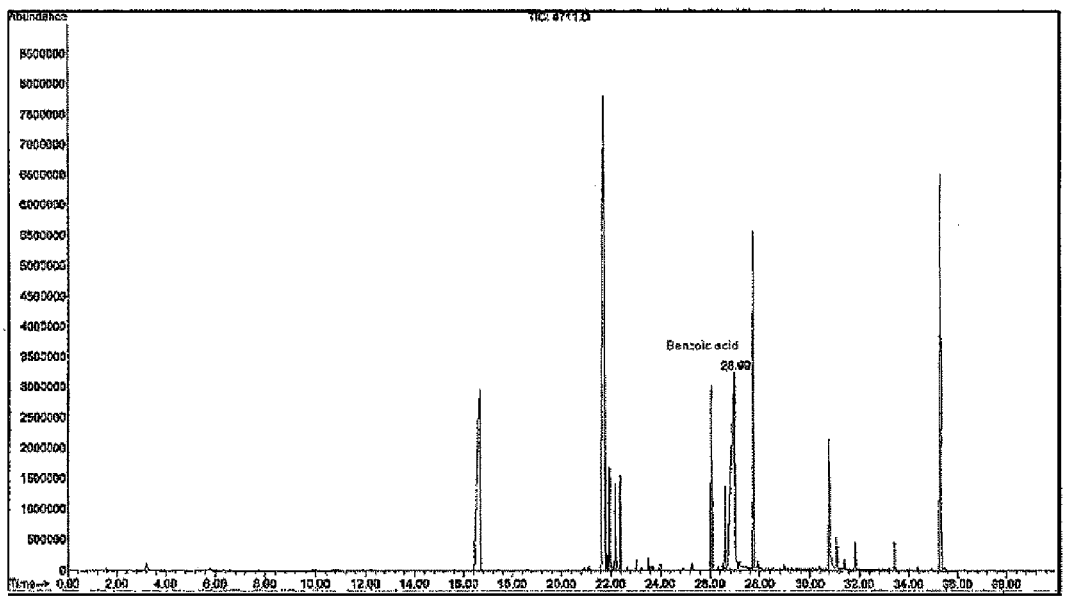
FIG. 3 is a GC-MS chart of the anisotropic conductive film of Example 2.

The peel strength of the obtained connection structures was measured as the adhesive strength by performing a 90° peel test in which a COF substrate or a TCP substrate was peeled from the PWB of the wiring structure at a peel rate of 50 mm/minute. Furthermore, the initial conduction resistance (Ω:max value) and a later-stage conduction resistance (Ω:max value) obtained after holding for 500 hours in a thermostatic bath with a temperature of 85° C. and a humidity of 85% RH, were measured with a multimeter (model number 34401A, Agilent). The obtained results are shown in Table 1. In addition, the measurement results of peel strength (N/cm) are shown in Table 3. Further, the anisotropic conductive film of Example 2 was subjected to GC-MS analysis in the same manner as Reference Example A2. The obtained chart is illustrated in FIG. 3. From FIG. 3, it can be seen that the anisotropic conductive film of Example 2 produces benzoic acid.

Preferred ranges for the initial conduction resistance, the later-stage conduction resistance after leaving under high temperature and high humidity, and the peel strength between the COF substrate and the PWB and between the TCP substrate and PWB are as follows.
<Peel Strength>
COF/PWB: 6.0 to 12.0 N/cm
TCP/PWB: 10 to 15 N/cm
<Initial Conduction Resistance (Max Value)>
COF/PWB: 0.10 to 0.13Ω
TCP/PWB: 0.035 to 0.060Ω
<Later-stage Conduction Resistance after Leaving Under High Temperature, High Humidity (Max Value)>
COF/PWB: 0.11 to 0.20Ω
TCP/PWB: 0.050 to 0.200Ω
(Overall Evaluation)

Furthermore, anisotropic conductive films having all of these evaluation results within the preferred ranges were evaluated as "good" (G), anisotropic conductive films having more preferred results even among those were evaluated as "excellent" (E), and anisotropic conductive films having even one item not in the above ranges were evaluated as "no good" (NG). The obtained results are shown in Table 3.

TABLE 3

| | Example | | | Comparative Example | | | | | | |
|---|---|---|---|---|---|---|---|---|---|---|
| | 1 | 2 | 3 | 1 | 2 | 3 | 4 | 5 | 6 | 7 |
| Bilayer (A layer/B layer) Structure* | A1/ B1 | A2/ B1 | A3/ B1 | A1/ B2 | A2/ B2 | A2/ B3 | A4/ B1 | A4/ B2 | A1/ — | A2/ — |

TABLE 3-continued

|  | Example | | | Comparative Example | | | | | | |
| --- | --- | --- | --- | --- | --- | --- | --- | --- | --- | --- |
|  | 1 | 2 | 3 | 1 | 2 | 3 | 4 | 5 | 6 | 7 |
| A layer/B layer Thickness (μm) | 18/18 | 18/18 | 18/18 | 18/18 | 18/18 | 18/18 | 18/18 | 18/18 | 36/— | 36/— |
| Peel Strength (N/cm) | | | | | | | | | | |
| COF/PWB | 6.0 | 9.0 | 12.0 | 6.3 | 6.5 | 3.0 | 4.5 | 4.3 | 6.0 | 5.0 |
| TCP/PWB | 13.5 | 14.8 | 15.0 | 13.8 | 11.0 | 10.0 | 10.5 | 10.2 | 13.6 | 12.8 |
| Initial Conduction Resistance (Ω) | | | | | | | | | | |
| COF/PWB | 0.10 | 0.10 | 0.12 | 0.13 | 0.16 | 0.11 | 0.13 | 0.12 | 0.10 | 0.11 |
| TCP/PWB | 0.036 | 0.038 | 0.040 | 0.059 | 0.100 | 0.040 | 0.060 | 0.060 | 0.036 | 0.036 |
| Later-Stage Conduction Resistance (Ω) | | | | | | | | | | |
| COF/PWB | 0.14 | 0.11 | 0.13 | 0.15 | 0.60 | 0.15 | 0.20 | 0.25 | 0.13 | 0.32 |
| TCP/PWB | 0.150 | 0.040 | 0.045 | open | open | 0.150 | open | Open | 0.750 | 0.041 |
| Tg (° C.) of Both A layer and B layer Cured Product | 72/72 | 91/72 | 92/72 | 72/74 | 91/74 | 91/68 | 74/74 | 74/74 | 72/— | 91/— |
| Tg (° C.) Difference Between A layer and B layer Cured Product | 0 | 19 | 20 | 2 | 17 | 23 | 2 | 0 | 0 | 0 |
| Tg (° C.) of Total Bilayer Cured Product | 72 | 82 | 84 | 73 | 85 | 79 | 73 | 72 | 72 | 91 |
| Overall Evaluation | G | E | E | NG | NG | NG | NG | NG | NG | NG |

*1: Film-forming of Compositions of Reference Examples A1 to A4 and Reference Examples B1 to B3

From Table 3, it can be seen that the anisotropic conductive films of Examples 1 to 3, which used dilauroyl peroxide (low-temperature decomposable peroxide) and dibenzoyl peroxide (high-temperature decomposable peroxide) for both the insulating adhesive layer and the anisotropic conductive adhesive layer as the polymerization initiator, had a small conduction resistance, and therefore exhibited excellent conduction reliability, yet also exhibited excellent adhesive strength. In particular, the anisotropic conductive films of Examples 2 and 3, which contained a phenoxy resin having a fluorene skeleton for the film-forming resin of the anisotropic conductive adhesive layer, had a higher peel strength between the COF substrate and the PWB than Example 1. Therefore, it can be seen that the anisotropic conductive films of Examples 2 and 3 are more suitable as anisotropic conductive films for use in both TCP substrates and COF substrates.

In contrast, the anisotropic conductive films of Comparative Examples 1 to 5, which only used either a low-temperature decomposable peroxide or a high-temperature decomposable peroxide for either the insulating adhesive layer or the anisotropic conductive adhesive layer, failed to achieve results satisfying all of the evaluation items. More specifically, in the anisotropic conductive films of Comparative Examples 1, 2, 4 and 5, since an insulating adhesive layer or an anisotropic conductive adhesive layer having a problem with low-temperature curability was used, especially, the later-stage conduction resistance for TCP substrates dramatically increased (became open), so that there was a problem with conduction reliability for TCP substrates. Further, in Comparative Example 3, since a peroxide which produced benzoic acid was not used in the insulating adhesive layer, the peel strength with respect to COF substrates was low, so that there was a problem with adhesive strength. Moreover, the anisotropic conductive film of Comparative Example 6 did not use an insulating adhesive layer, and thus Tg was lower than in other examples. Consequently, later-stage conduction resistance for TCP substrates increased, so that there was a problem with conduction reliability for TCP substrates. In addition, since the anisotropic conductive film of Comparative Example 7 did not use an insulating adhesive layer, the peel strength with respect to COF substrates was low, so that there was a problem with adhesive strength.

Figure 4:
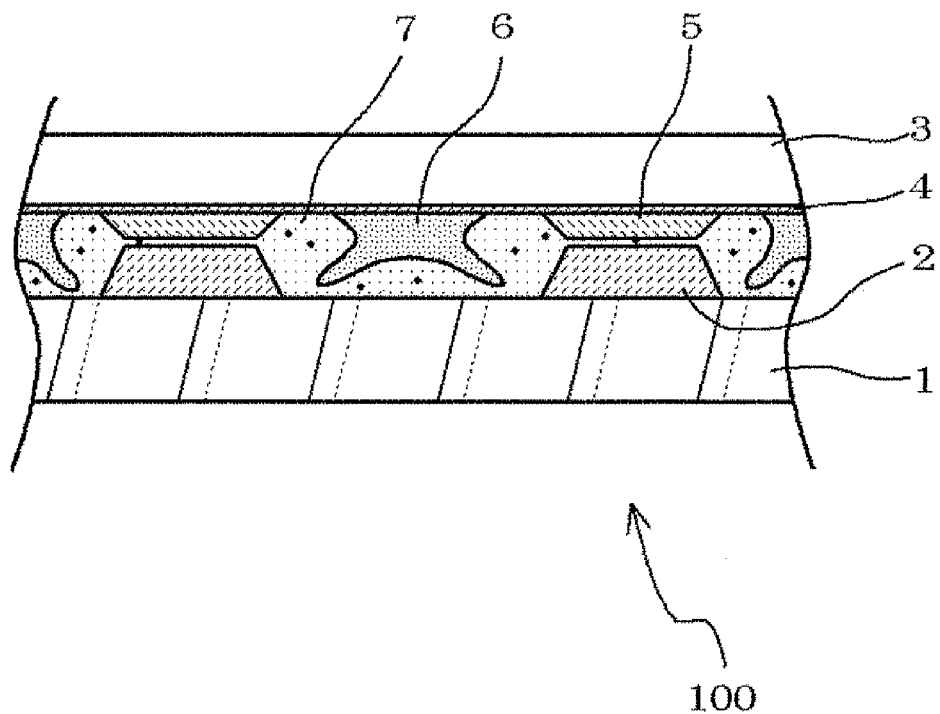
FIG. 4 is a cross-sectional pattern diagram of the connection structure produced in Example 2.

When a TCP/PWB connection structure produced using the anisotropic conductive film of Example 2 was cut open, as illustrated in FIG. 4, it could be seen that an adhesive layer between adjacent electrodes had a unique structure. More specifically, this connection structure 100 connected an electrode 2 of a PWB substrate 1 and an electrode 5 on an adhesive layer 4 of a TCP substrate 3 with an anisotropic conductive film. However, it could be seen that not only was an insulating adhesive layer 6 widespread in roughly the middle between the adjacent electrodes, but the insulating adhesive layer 6 was shaped as if "legs" extended left and right into an anisotropic conductive adhesive layer 7 on the PWB side. Due to having such a structure, the anisotropic conductive adhesive layer, which has a high glass transition temperature and a strong cohesive force, pulls the TCP and the PWB strongly together. On the other hand, the insulating adhesive layer, which has a low glass transition temperature, alleviates the stress in the connection portions, so that peel strength is improved. Consequently, low-temperature rapid-curing, a high peel strength with respect to a COF substrate, and high conduction reliability for a TCP substrate can be realized.

Examples 4 to 7

Anisotropic conductive films were produced by repeating Example 2, except for varying the thicknesses of the insulating adhesive layer and the anisotropic conductive adhesive layer of the anisotropic conductive film of Example 2 as shown in Table 4. The produced anisotropic conductive films were then evaluated in the same manner as in Example 2. The obtained results are shown in Table 4. The same overall evaluation results as for Example 2 were exhibited even when the thicknesses of the insulating adhesive layer and the anisotropic conductive layer varied between 9:27 to 27:9.

TABLE 4

|  | Example | | | | |
| --- | --- | --- | --- | --- | --- |
|  | 4 | 5 | 2 | 6 | 7 |
| Bilayer (A layer/B layer) Structure* | A2/B1 | A2/B1 | A2/B1 | A2/B1 | A2/B1 |
| A layer/B layer Thickness (μm) | 9/27 | 14/22 | 18/18 | 24/12 | 27/9 |
| Peel Strength (N/cm) | | | | | |
| COF/PWB | 11.2 | 8.7 | 9.0 | 11.8 | 13.1 |
| TCP/PWB | 20.6 | 16.7 | 14.8 | 13.8 | 14.0 |
| Initial Conduction Resistance (Ω) | | | | | |
| COF/PWB | 0.09 | 0.10 | 0.10 | 0.09 | 0.10 |
| TCP/PWB | 0.036 | 0.039 | 0.038 | 0.039 | 0.039 |
| Later-Stage Conduction Resistance (Ω) | | | | | |
| COF/PWB | 0.11 | 0.10 | 0.11 | 0.10 | 0.10 |
| TCP/PWB | 0.044 | 0.040 | 0.040 | 0.046 | 0.047 |
| Tg (° C.) of Both A layer and B layer Cured Product | 91/72 | 91/72 | 91/72 | 91/72 | 91/72 |
| Tg (° C.) Difference Between A layer and B layer Cured Product | 19 | 19 | 19 | 19 | 19 |
| Tg (° C.) of Total Bilayer Cured Product | 82 | 82 | 82 | 82 | 82 |
| Overall Evaluation | E | E | E | E | E |

*1: Film-forming of Compositions of Reference Examples A2 and B1

Examples 8 and 9

Anisotropic conductive films were produced by repeating Example 2, except for changing the compression conditions of the anisotropic conductive film of Example 2 in the following manner as shown in Table 5. The produced anisotropic conductive films were then evaluated in the same manner as in Example 2. The obtained results are shown in Table 5. The same overall evaluation results as for Example 2 were exhibited even when for compression at a lower temperature. Moreover, the same overall evaluation results as for Example 2 were exhibited even when for compression at a higher temperature.

<Compression Conditions in Example 8>
COF/PWB (120° C., 3 MPa, 3 seconds), TCP/PWB (130° C., 3 MPa, 3 seconds)<

<Compression Conditions in Example 9>
COF/PWB (180° C., 3 MPa, 3 seconds), TCP/PWB (180° C., 3 MPa, 3 seconds)

<Compression Conditions in Example 2>
COF/PWB (130° C., 3 MPa, 3 seconds), TCP/PWB (140° C., 3 MPa, 3 seconds)

TABLE 5

|  | Example | | |
| --- | --- | --- | --- |
|  | 8 | 2 | 9 |
| Bilayer (A layer/B layer) Structure* | A2/B1 | A2/B1 | A2/B1 |
| A layer/B layer Thickness (μm) | 18/18 | 18/18 | 18/18 |
| Peel Strength (N/cm) | | | |
| COF/PWB | 8.1 | 9.0 | 13.6 |
| TCP/PWB | 14.4 | 14.8 | 16.3 |
| Initial Conduction Resistance (Ω) | | | |
| COF/PWB | 0.11 | 0.10 | 0.10 |
| TCP/PWB | 0.038 | 0.038 | 0.038 |
| Later-Stage Conduction Resistance (Ω) | | | |
| COF/PWB | 0.11 | 0.11 | 0.11 |
| TCP/PWB | 0.047 | 0.040 | 0.046 |
| Tg (° C.) of Both A layer and B layer Cured Product | 91/72 | 91/72 | 91/72 |
| Tg (° C.) Difference Between A layer and B layer Cured Product | 19 | 19 | 19 |
| Tg (° C.) of Total Bilayer Cured Product | 82 | 82 | 82 |
| Overall Evaluation | E | E | E |

*1: Film-forming of Compositions of Reference Examples A2 and B1

Industrial Applicability

The anisotropic conductive film according to the present invention can anisotropically connect at low temperatures and rapid curing. Therefore, anisotropic connection can be achieved without applying thermal stress on a connection target, which is useful for high reliability anisotropic connection of precision electronic components.

DESCRIPTION OF REFERENCE NUMERAL

1 PWB substrate
2 electrode
3 TCP substrate
4 adhesive layer
5 electrode
6 insulating adhesive layer
7 anisotropic conductive adhesive layer
100 connection structure

The invention claimed is:

1. An anisotropic conductive film comprising an insulating adhesive layer and an anisotropic conductive adhesive layer laminated thereon, wherein
the insulating adhesive layer and the anisotropic conductive adhesive layer each contain a polymerizable acrylic compound, a film-forming resin and a polymerization initiator, the anisotropic conductive adhesive layer further containing conductive particles,
the polymerization initiator contains two kinds of organic peroxide having different one minute half-life temperatures, the organic peroxide having a higher one minute half-life temperature of the two kinds of organic peroxide producing benzoic acid or a derivative thereof by decomposition, and
a glass transition temperature of a cured product of the anisotropic conductive adhesive layer is higher than a glass transition temperature of a cured product of the insulating adhesive layer.

2. The anisotropic conductive film according to claim 1, wherein of the two kinds of organic peroxide, the organic peroxide having a lower one minute half-life temperature has a one minute half-life temperature of 80° C. or more to less than 120° C. and the organic peroxide having the higher one minute half-life temperature has a one minute half-life temperature of 120° C. or more to 150° C. or less.

3. The anisotropic conductive film according to claim 1, wherein a difference in one minute half-life temperatures between the two kinds of organic peroxide having different decomposition temperatures is 10° C. or more to 30° C. or less.

4. The anisotropic conductive film according to claim 1, wherein a mass ratio of the organic peroxide having the lower one minute half-life temperature and the organic peroxide having the higher one minute half-life temperature of the two kinds of organic peroxide is 10:1 to 1:5.

5. The anisotropic conductive film according to claim 1, wherein of the two kinds of organic peroxide, the organic peroxide having the lower one minute half-life temperature is dilauroyl peroxide, and the organic peroxide having the higher one minute half-life temperature is dibenzoyl peroxide.

6. The anisotropic conductive film according to claim 1, wherein the film-forming resin contains a polyester resin, a polyurethane resin, or a phenoxy resin.

7. The anisotropic conductive film according to claim 1, wherein the film-forming resin in the anisotropic conductive adhesive layer contains a phenoxy resin having a fluorene skeleton.

8. The anisotropic conductive film according to claim 1, where glass transition temperature of the cured product of the anisotropic conductive adhesive layer is higher than the glass transition temperature of the cured product of the insulating adhesive layer by 10 to 20° C.

9. A connection structure wherein a connection portion of a first wiring substrate and a connection portion of a second wiring substrate are anisotropically connected by the anisotropic conductive film according to claim 1.

10. The connection structure according to claim 9, wherein the first wiring substrate is a chip-on-film substrate or a tape carrier package substrate, the second wiring substrate is a printed wiring board, and the insulating adhesive layer of the anisotropic conductive film is arranged on a first wiring substrate side;

wherein the film-forming resin in the anisotropic conductive adhesive layer contains a phenoxy resin having a fluorene skeleton.

11. A method for producing a connection structure, comprising:

sandwiching the anisotropic conductive film according to claim 1 between a connection portion of a first wiring substrate and a connection portion of a second wiring substrate;

temporarily bonding the anisotropic conductive film with the first and second wiring substrates at a first temperature at which the organic peroxide having a lower one minute half-life temperature does not decompose; and then thermo-compressing the anisotropic conductive film with the first and second wiring substrates at a second temperature at which the organic peroxide having the higher one minute half-life temperature does decompose.

* * * * *